(12) United States Patent
Liu

(10) Patent No.: US 6,294,457 B1
(45) Date of Patent: Sep. 25, 2001

(54) OPTIMIZED IMD SCHEME FOR USING ORGANIC LOW-K MATERIAL AS IMD LAYER

(75) Inventor: Chung-Shi Liu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/774,418

(22) Filed: Feb. 1, 2001

(51) Int. Cl.[7] .................. H01L 21/4763; H01L 21/44
(52) U.S. Cl. .................. 438/623; 438/597; 438/631; 438/759; 438/763
(58) Field of Search .................. 438/763, 624, 438/631, 699, 623, 760, 759, 787, 597

(56) References Cited

U.S. PATENT DOCUMENTS

| | | | |
|---|---|---|---|
| 5,741,626 | * | 4/1998 | Jain et al. ............... 430/314 |
| 5,858,870 | * | 1/1999 | Zheng et al. ............ 438/622 |
| 5,891,799 | * | 4/1999 | Tsui ........................ 438/624 |
| 6,004,188 | * | 12/1999 | Roy ........................ 451/41 |
| 6,011,809 | * | 1/2000 | Tosaka ................... 372/21 |
| 6,025,277 | * | 2/2000 | Chen et al. ............. 438/738 |
| 6,071,809 | | 6/2000 | Zhao ...................... 438/634 |
| 6,080,529 | * | 6/2000 | Ye et al. ................. 430/318 |
| 6,083,850 | * | 7/2000 | Shields .................. 438/763 |
| 6,100,181 | * | 8/2000 | You et al. ............... 438/633 |
| 6,143,646 | * | 11/2000 | Wetzel ................... 438/637 |
| 6,165,695 | * | 12/2000 | Yang et al. ............. 430/314 |
| 6,180,512 | * | 1/2001 | Dai ......................... 438/627 |
| 6,242,344 | * | 6/2001 | Koh et al. ............... 438/638 |

* cited by examiner

Primary Examiner—Michael Lebentritt
(74) Attorney, Agent, or Firm—George O. Saile; Stephen B. Ackerman; Rosemary L. S. Pike

(57) ABSTRACT

A method of metallization wherein particle issues are avoided during pre-metal cleaning by the use of a unique IMD scheme is described. A semiconductor substrate is provided which may include semiconductor device structures. An etch stop layer is deposited overlying the semiconductor substrate. A low-dielectric constant material layer is deposited overlying the etch stop layer. A polish stop layer is deposited overlying the low-dielectric constant material layer. An oxide layer is deposited overlying the polish stop layer. An anti-reflective coating (ARC) layer is deposited overlying the oxide layer. An opening is etched through the ARC layer, oxide layer, polish stop layer, and low-dielectric constant material layer where they are not covered by a mask. The mask is removed during the etch. The etch stop layer is etched through within the opening whereby the ARC layer is removed. The opening is cleaned using an Argon sputtering method. Since the topmost layer of the IMD layer is an oxide layer, particles are not generated from this topmost layer. The opening is filled with a metal layer to complete metallization in the fabrication of an integrated circuit device.

26 Claims, 3 Drawing Sheets

OPTIMIZED IMD SCHEME FOR USING ORGANIC LOW-K MATERIAL AS IMD LAYER

BACKGROUND OF THE INVENTION (1) Field of the Invention

The invention relates to a method of metallization in the fabrication of integrated circuits, and more particularly, to a method of improving yield in a damascene method in the manufacture of integrated circuits.

(2) Description of the Prior Art

In a common application for integrated circuit fabrication, a contact/via opening is etched through an insulating layer to an underlying conductive area to which electrical contact is to be made. A conducting layer material is deposited within the contact/via opening. The damascene and dual damascene processes have become a future trend in metallization. Trenches or vias and trenches are etched in an insulating layer. The trenches or vias and trenches are inlaid with metal to complete the contacts. It is desired to use low dielectric constant (low-k) materials in order to reduce capacitance of the resulting devices. Silicon carbide (SiC) or silicon nitride (SiN) is widely used to improve adhesion when using organic low-k materials in the intermetal dielectric layers (IMD). To avoid micro-scratching during the final polishing metal step, a minimal amount of the low-k material should be polished. To accomplish this, a polish stop layer is provided over the low-k material. The use of SiC, SiN, or silicon oxynitride (SiON) as the polish stop layer will cause a problem at the pre-metal deposition step. After the trench has been etched through the IMD layer, an Ar sputtering cleaning step is performed. The polish stop layer, which is the topmost layer of the IMD layer, will be exposed to the Ar sputtering. The sputtering chamber walls are typically composed of quartz ($SiO_2$). Adhesion between the SiON and quartz is poor, resulting in peeling of the SiON on the chamber walls due to thermal stress from wafer to wafer processing. Particles generated from this peeling will undesirably contaminate the wafer. It is desired to find a IMD scheme that will avoid the particle issue and hence lead to yield improvement.

U.S. Pat. No. 6,100,181 to You et al discloses a dual damascene process. U.S. Pat. No. 6,083,850 to Shields uses HSQ, a low-k material, as a gap-filling layer. U.S. Pat. Nos. 5,891,799 to Tsui and 5,858,870 to Zheng et al teach non-damascene IMD schemes. U.S. Pat. No. 6,071,809 to Zhao shows a dual damascene process using a silicon nitride polish stop layer with an overlying protection layer. Preferably, the protection layer is silicon dioxide, but it may also be silicon oxynitride or other materials that will cause particle problems.

SUMMARY OF THE INVENTION

A principal object of the present invention is to provide an effective and very manufacturable method of metallization in the fabrication of integrated circuit devices.

Another object of the invention is to provide a method of metallization while avoiding particle issues during pre-metal cleaning.

A further object of the invention is to provide a method of metallization wherein particle issues are avoided during pre-metal cleaning by the use of a unique IMD scheme.

Yet another object of the invention is to provide a method of metallization wherein particle issues are avoided during pre-metal cleaning by the use of a unique IMD scheme including a silicon oxide layer overlying the polish stop layer.

In accordance with the objects of this invention a new method of metallization wherein particle issues are avoided during pre-metal cleaning by the use of a unique IMD scheme is achieved. A semiconductor substrate is provided which may include semiconductor device structures. An etch stop layer is deposited overlying the semiconductor substrate. A low-dielectric constant material layer is deposited overlying the etch stop layer. A polish stop layer is deposited overlying the low-dielectric constant material layer. An oxide layer is deposited overlying the polish stop layer. An anti-reflective coating (ARC) layer is deposited overlying the oxide layer. An opening is etched through the ARC layer, oxide layer, polish stop layer, and low-dielectric constant material layer where they are not covered by a mask. The mask is removed during etching. The etch stop layer is etched through within the opening whereby the ARC layer is removed. The opening is cleaned using an Argon sputtering method. Since the topmost layer of the IMD layer is an oxide layer, particles are not generated from this topmost layer. The opening is filled with a metal layer to complete metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
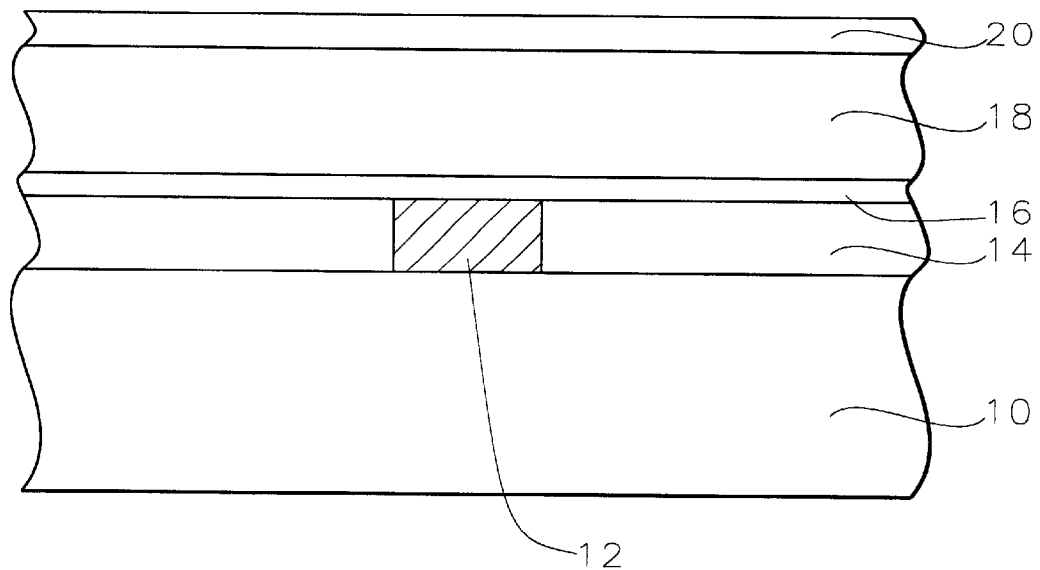
FIGS. 1 through 5 schematically illustrate in cross-sectional representation a preferred embodiment of the present invention.

The present invention provides a metallization method using a unique IMD scheme wherein particle issues are avoided during pre-metal cleaning. A single damascene process is illustrated in the drawing figures. It will be understood by those skilled in the art that the present invention should not be limited to the application illustrated, but that the process of the present invention can be extended and applied to other applications without departing from the spirit and scope of the invention.

A single damascene process will be described. It is to be understood that a dual damascene process may be used instead of the illustrated single damascene process. Referring now more particularly to FIG. 1, there is illustrated a portion of a partially completed integrated circuit device. There is shown a semiconductor substrate 10, preferably composed of monocrystalline silicon. Semiconductor device structures, such as gate electrodes and source and drain regions, not shown, may be formed in and on the semiconductor substrate. These semiconductor device structures are covered with a n insulating layer such as silicon oxide. Lower levels of metallization may also be provided. The silicon substrate, semiconductor device structures and insulating layer thereover are represented by 10 in FIG. 1. A lower level metallization, such as tungsten plug 12, for example, is shown in an insulating layer 14 overlying the substrate 10 and contacting an underlying device, not shown.

Now, a first etch stop layer is deposited over the tungsten plug, for example. Silicon nitride (SiN) or silicon carbide (SiC) may be used as this etch stop layer and to improve adhesion with the overlying IMD layer. The first etch stop layer 16 is deposited to a thickness of between about 100 and 500 Angstroms, and preferably about 300 Angstroms.

Now, a low dielectric constant material 18 is deposited over the etch stop layer 16 to a thickness of between about 2000 and 8000 Angstroms, and preferably about 3000 Angstroms. This low-k material may be SILK (TM) by Dow Chemical or FLARE (TM) by Allied Signal, for example.

Now, a polish stop layer 20 is deposited over the low-k layer 18. This layer may be SiN or SiC and has a thickness of between about 100 and 500 Angstroms, and preferably about 300 Angstroms.

Figure 2:
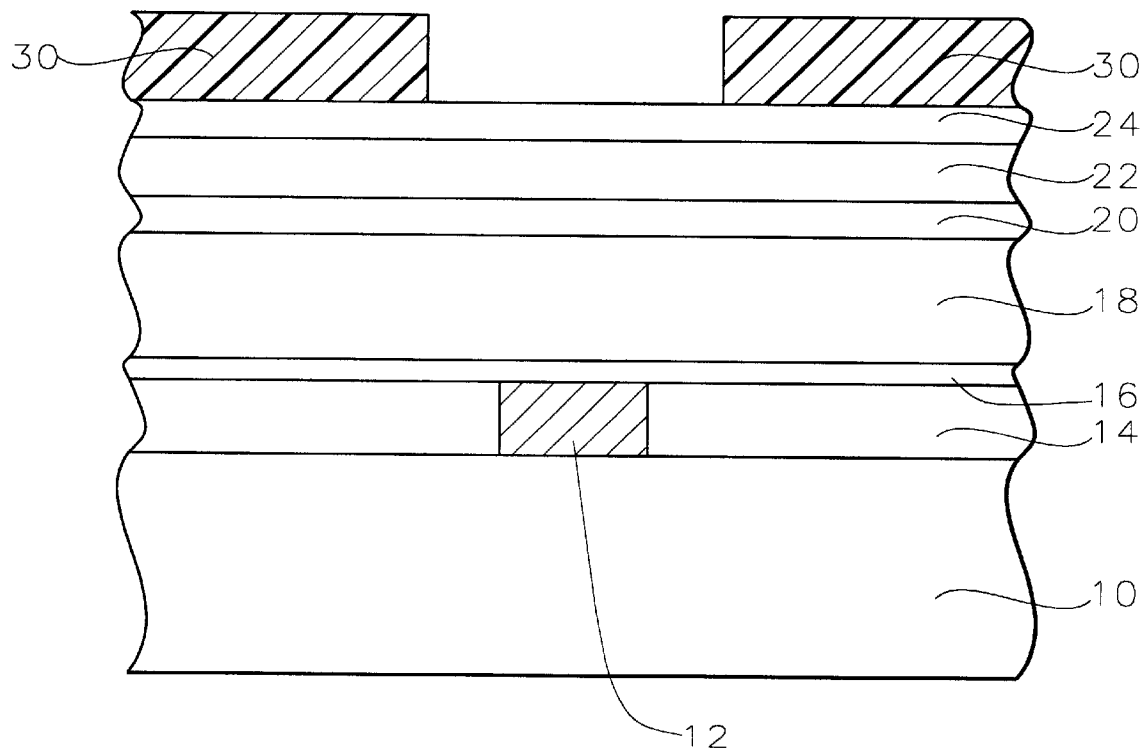

Referring now to FIG. 2, the unique IMD layer scheme of the invention will be described. An additional layer 22 is deposited over the polish stop layer 20. The layer 22 comprises silicon dioxide and has a thickness of between about 500 and 2000 Angstroms, and preferably about 1000 Angstroms. It is a key feature of the invention that this layer 22 comprises silicon dioxide; that is, the same material as comprises the walls of the Ar sputter chamber.

Now, an anti-reflective coating (ARC) layer 24, typically SiON, is coated over the oxide layer 22 to a thickness of between about 400 and 900 Angstroms, and preferably 600 angstroms. A photoresist mask 30 is formed over the ARC layer 24 with an opening where the damascene metallization will be formed.

Figure 3:
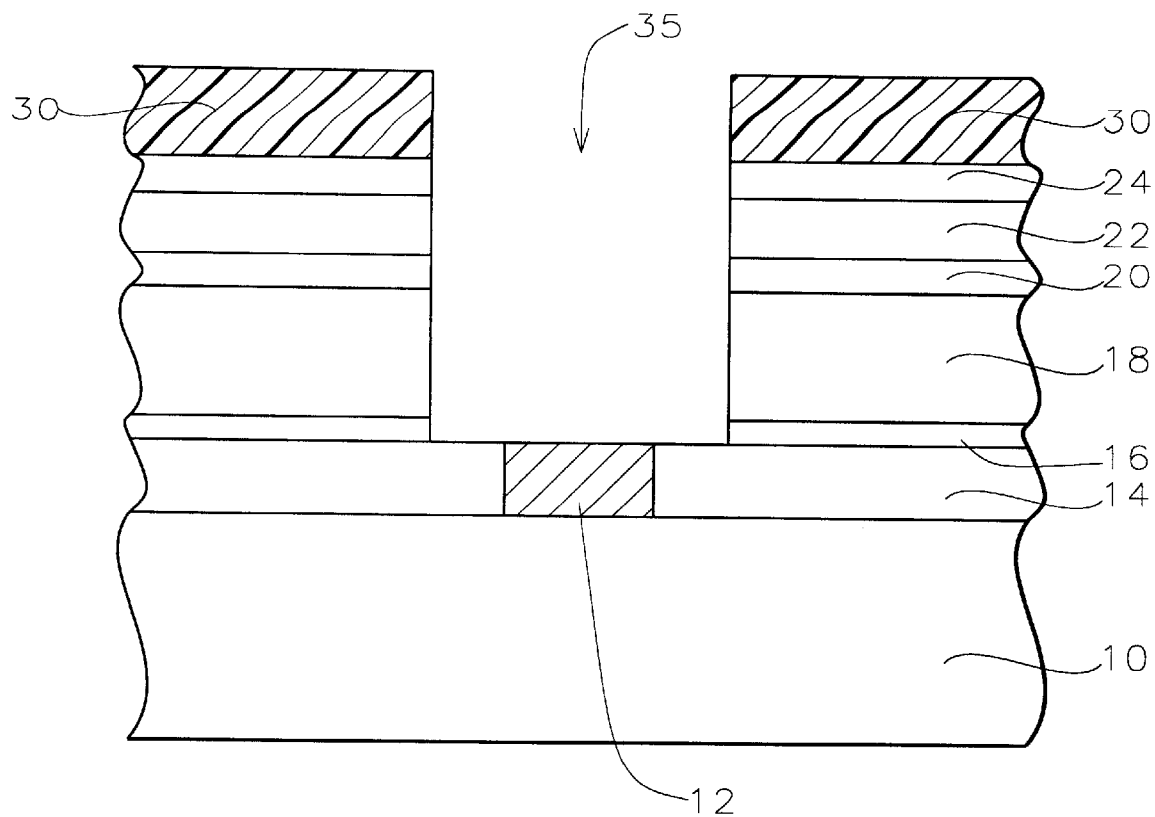

Referring now to FIG. 3, a damascene opening 35 is etched through the ARC layer 24 and the IMD layer 22, 20, and 18 with an etch stop at the etch stop layer 16. The photoresist mask 30 is removed during the IMD layer etch, typically an oxygen plasma etch.

Figure 4:
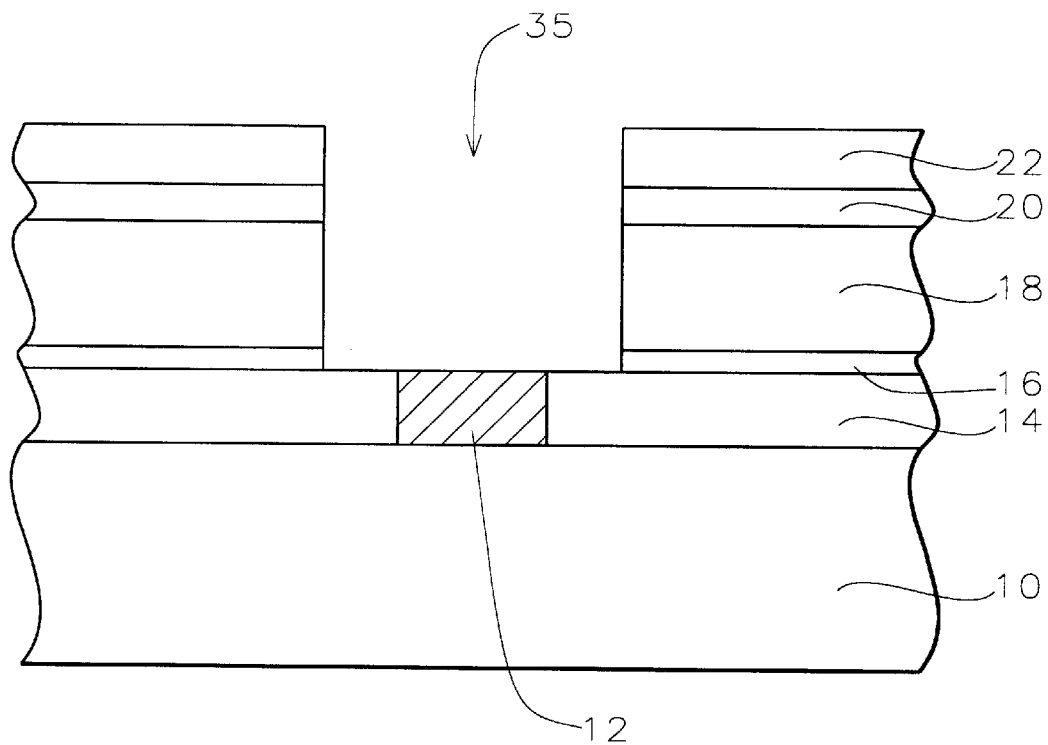

Now, referring to FIG. 4, the etch stop layer 16 is removed within the damascene opening 35. The ARC layer 24 is removed also during this etching, typically using $C_xF_y$-based chemistry. The topmost layer of the IMD layer is now the oxide layer 22.

Now, a pre-metal cleaning is performed. This is typically an Ar sputtering step. Since the topmost layer is an oxide layer, rather than a nitride or carbide layer as in the prior art, there will be no particles generated during the sputtering. The oxide will adhere well to the chamber walls of the same material and will not peel due to thermal stress causing particle contamination. Thus, the particle problem after pre-metal clean is avoided.

Figure 5:
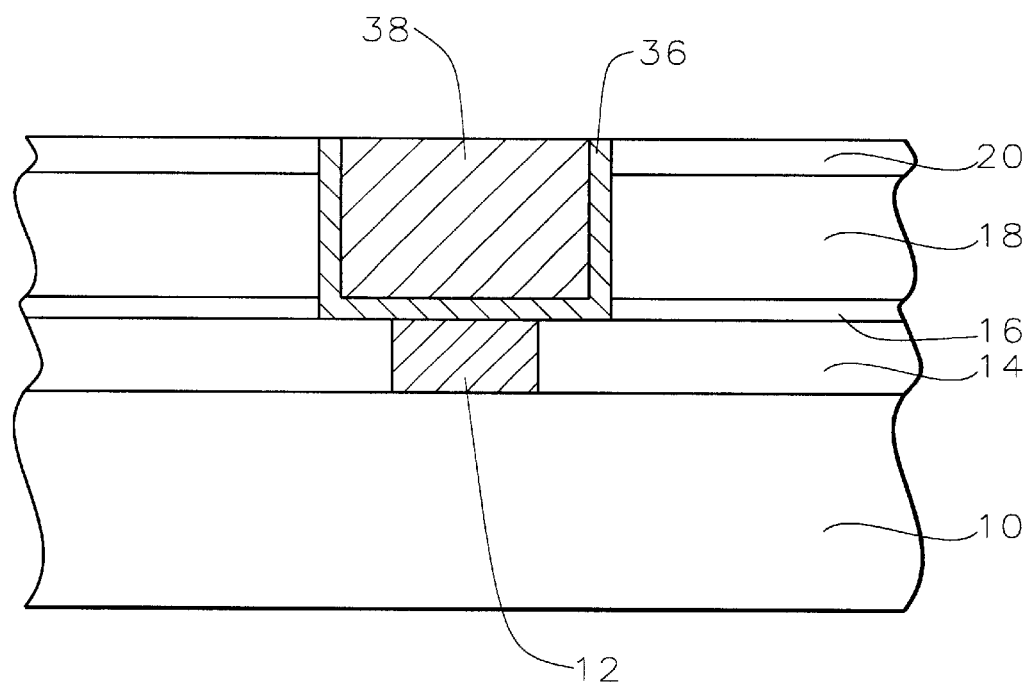

Now, metallization is to be performed. First, a barrier metal layer 36, such as tantalum nitride or tantalum is deposited into the damascene opening, as shown in FIG. 5, followed by a copper seed layer, for example, not shown. A metal, such as copper 38, is formed within the damascene opening, for example, by electrochemical plating. The excess metal is polished away to the surface of the IMD layer, using the layer 20 as a polish stop to complete the metal inlay 38, as illustrated in FIG. 5. Processing continues as is conventional in the art to complete fabrication of the integrated circuit device.

The process of the present invention avoids particle problems during pre-metal cleaning by the use of a unique IMD scheme in which the topmost layer during pre-metal clean is a silicon dioxide layer; that is, the same material as that comprising the walls of the pre-metal cleaning chamber. The sputtered silicon dioxide particles will adhere to the chamber walls and not be removed during thermal stress to cause particle contamination.

While the invention has been particularly shown and described with reference to the preferred embodiments thereof, it will be understood by those skilled in the art that various changes in form and details may be made without departing from the spirit and scope of the inventions

What is claimed is:

1. A method of metallization in the fabrication of an integrated circuit device comprising:

providing a semiconductor substrate;

depositing an etch stop layer overlying said semiconductor substrate;

depositing a low-dielectric constant material layer overlying said etch stop layer;

depositing a polish stop layer overlying said low-dielectric constant material layer;

depositing an oxide layer overlying said polish stop layer;

depositing an anti-reflective coating (ARC) layer overlying said oxide layer;

etching an opening through said ARC layer, said oxide layer, said polish stop layer, and said low-dielectric constant material layer where they are not covered by a mask and removing said mask;

thereafter etching through said etch stop layer within said opening whereby said ARC layer is removed;

thereafter cleaning said opening using an Argon sputtering method; and filling said opening with a metal layer to complete said metallization in the fabrication of said integrated circuit device.

2. The method according to claim 1 wherein said semiconductor substrate comprises semiconductor device structures including gate electrodes and associated source and drain regions formed in and on a silicon substrate.

3. The method according to claim 1 wherein said etch stop layer comprises silicon nitride having a thickness of between about 100 and 500 Angstroms.

4. The method according to claim 1 wherein said etch stop layer comprises silicon carbide having a thickness of between about 100 and 500 Angstroms.

5. The method according to claim 1 wherein said low-dielectric constant material layer comprises one of the group containing SILK (TM) and FLARE (TM) and wherein said layer has a thickness of between about 2000 and 8000 Angstroms.

6. The method according to claim 1 wherein said polish stop layer comprises silicon nitride having a thickness of between about 100 and 500 Angstroms.

7. The method according to claim 1 wherein said polish stop layer comprises silicon carbide having a thickness of between about 100 and 500 Angstroms.

8. The method according to claim 1 wherein said oxide layer comprises silicon dioxide having a thickness of between about 500 and 2000 Angstroms.

9. The method according to claim 1 wherein said ARC layer comprises silicon oxynitride having a thickness of between about 400 and 900 Angstroms.

10. The method according to claim 1 further comprising depositing a barrier metal layer within said opening before said step of filling said opening with said metal layer wherein said barrier metal layer comprises tantalum nitride having a thickness of between about 100 and 500 Angstroms.

11. The method according to claim 1 wherein said metal layer comprises copper.

12. A method of metallization in the fabrication of an integrated circuit device comprising:

providing a semiconductor substrate;

depositing an etch stop layer overlying said semiconductor substrate;

depositing a low-dielectric constant material layer overlying said etch stop layer;

depositing a polish stop layer overlying said low-dielectric constant material layer;

depositing an oxide layer overlying said polish stop layer;

depositing an anti-reflective coating (ARC) layer overlying said oxide layer;

etching an opening through said ARC layer, said oxide layer, said polish stop layer, and said low-dielectric constant material layer where they are not covered by a mask and removing said mask;

thereafter etching through said etch stop layer within said opening whereby said ARC layer is removed and whereby said oxide layer is exposed as a topmost layer;

thereafter cleaning said opening using an Argon sputtering method within a sputtering chamber wherein particles from said topmost layer adhere to walls of said sputtering chamber; and filling said opening with a metal layer to complete said metallization in the fabrication of said integrated circuit device.

13. The method according to claim 12 wherein said semiconductor substrate comprises semiconductor device structures including gate electrodes and associated source and drain regions formed in and on a silicon substrate.

14. The method according to claim 12 wherein said etch stop layer comprises one of the group containing silicon nitride and silicon carbide having a thickness of between about 100 and 500 Angstroms.

15. The method according to claim 12 wherein said low-dielectric constant material layer comprises one of the group containing SILK (TM) and FLARE (TM) and wherein said layer has a thickness of between about 2000 and 8000 Angstroms.

16. The method according to claim 12 wherein said polish stop layer comprises one of the group containing silicon nitride and silicon carbide having a thickness of between about 100 and 500 Angstroms.

17. The method according to claim 12 wherein said oxide layer comprises silicon dioxide having a thickness of between about 500 and 2000 Angstroms.

18. The method according to claim 12 wherein said ARC layer comprises silicon oxynitride having a thickness of between about 400 and 900 Angstroms.

19. The method according to claim 13 further comprising depositing a barrier metal layer within said opening before said step of filling said opening with said metal layer wherein said barrier metal layer comprises tantalum nitride having a thickness of between about 100 and 500 Angstroms.

20. The method according to claim 12 wherein said metal layer comprises copper.

21. A method of metallization in the fabrication of an integrated circuit device comprising:

providing a semiconductor substrate comprising semiconductor device structures including gate electrodes and associated source and drain regions formed in and on a silicon substrate;

depositing an etch stop layer overlying said semiconductor substrate;

depositing a low-dielectric constant material layer overlying said etch stop layer;

depositing a polish stop layer overlying said low-dielectric constant material layer;

depositing an oxide layer overlying said polish stop layer;

depositing an anti-reflective coating (ARC) layer overlying said oxide layer;

etching an opening through said ARC layer, said oxide layer, said polish stop layer, and said low-dielectric constant material layer where they are not covered by a mask and removing said mask;

thereafter etching through said etch stop layer within said opening whereby said ARC layer is removed and whereby said oxide layer is exposed as a topmost layer;

thereafter cleaning said opening using an Argon sputtering method within a sputtering chamber wherein particles from said topmost layer adhere to walls of said sputtering chamber;

depositing a barrier metal layer within said opening; and filling said opening with a metal layer to complete said metallization in the fabrication of said integrated circuit device.

22. The method according to claim 21 wherein said etch stop layer comprises one of the group containing silicon nitride and silicon carbide having a thickness of between about 100 and 500 Angstroms.

23. The method according to claim 21 wherein said low-dielectric constant material layer comprises one of the group containing SILK (TM) and FLARE (TM) and wherein said layer has a thickness of between about 2000 and 8000 Angstroms.

24. The method according to claim 21 wherein said polish stop layer comprises one of the group containing silicon nitride and silicon carbide having a thickness of between about 100 and 500 Angstroms.

25. The method according to claim 21 wherein said oxide layer comprises silicon dioxide having a thickness of between about 500 and 2000 Angstroms.

26. The method according to claim 21 wherein said ARC layer comprises silicon oxynitride having a thickness of between about 400 and 900 Angstroms.

* * * * *